United States Patent [19]

Somekh et al.

[11] Patent Number: 5,556,147
[45] Date of Patent: Sep. 17, 1996

[54] WAFER TRAY AND CERAMIC BLADE FOR SEMICONDUCTOR PROCESSING APPARATUS

[75] Inventors: Sasson Somekh, Los Altos Hills; Kevin Fairbairn, Saratoga; Gary M. Kolstoe, Fremont; Gregory W. White, San Carlos; W. George Faraco, Jr., Saratoga, all of Calif.

[73] Assignee: Applied Materials, Inc., Santa Clara, Calif.

[21] Appl. No.: 438,328

[22] Filed: May 10, 1995

Related U.S. Application Data

[60] Division of Ser. No. 205,711, Mar. 3, 1994, which is a continuation-in-part of Ser. No. 93,236, Jul. 15, 1993, abandoned.

[51] Int. Cl.$^6$ ..................................... B25J 15/06
[52] U.S. Cl. .................. 294/64.1; 414/939; 294/907; 901/40; 901/46
[58] Field of Search .................. 294/64.1, 64.2, 294/64.3, 27.1, 32, 902, 907; 901/40, 46; 29/743; 414/935–941, 222, 225

[56] References Cited

U.S. PATENT DOCUMENTS

| | | | |
|---|---|---|---|
| 4,682,928 | 7/1987 | Foulke et al. | 414/416 |
| 4,720,130 | 1/1988 | Andou | 294/64.1 |
| 4,773,687 | 9/1988 | Bush et al. | 294/64.1 |
| 4,850,631 | 7/1989 | Dotsko | 294/907 |
| 4,951,601 | 8/1990 | Maydan et al. | 118/719 |
| 4,960,298 | 10/1990 | Moroi | 294/64.1 |
| 5,004,399 | 4/1991 | Sullivan et al. | 414/729 |
| 5,046,909 | 9/1991 | Murdoch | 414/225 |
| 5,054,831 | 10/1991 | Ting et al. | 294/907 |
| 5,061,144 | 10/1991 | Akimoto et al. | 414/225 |
| 5,445,486 | 8/1995 | Kitayama et al. | 414/937 |

FOREIGN PATENT DOCUMENTS

| | | |
|---|---|---|
| 2539036 | 9/1975 | Denmark. |
| 0392399 | 4/1990 | European Pat. Off.. |
| 0513651 | 5/1992 | European Pat. Off.. |
| 3743630 | 3/1989 | Germany ............................. 294/902 |

*Primary Examiner*—Dean Kramer
*Attorney, Agent, or Firm*—John P. Taylor

[57] ABSTRACT

A semiconductor wafer processing system for processing wafers from a wafer storage cassette includes a wafer transfer chamber; a wafer storage elevator within the transfer chamber; one or more wafer processing chambers; and a wafer transfer apparatus for transferring a wafer between a standard storage cassette adjacent and outside the transfer chamber and the elevator, and between the elevator and the processing chamber. The environment of the storage chamber varies in pressure between atmospheric when accepting wafers from outside, and a subatmospheric pressure when transferring wafers to or from a processing chamber. The transfer apparatus includes a robot arm; a thin flat wafer carrying blade at the leading end of the robot arm and configured for engaging a wafer from the storage cassette or the elevator; and a wafer support tray which is configured for removable engagement with the blade and for engaging and positively positioning a wafer from the elevator, or a support pedestal within a processing chamber. When the transfer apparatus moves a wafer between the elevator and a processing chamber in an evacuated environment, the tray is engaged with the blade and helps retain the wafer during transit. When wafers are transferred between the cassette and the elevator at atmospheric pressure the tray is disengaged from the blade and placed in a rest position on the elevator, and the wafer transfer is performed by means of the blade alone with a vacuum pick integral to the blade. The blade includes upper and lower halves together defining vacuum channels and capacitive position sensors.

9 Claims, 9 Drawing Sheets

WAFER TRAY AND CERAMIC BLADE FOR SEMICONDUCTOR PROCESSING APPARATUS

CROSS-REFERENCE TO RELATED APPLICATION

This application is a division of application Ser. No. 08/205,711, filed Mar. 3, 1994 as a continuation-in-part application Ser. No. 08/093,236, filed on Jul. 15, 1993 now abandoned.

BACKGROUND OF THE INVENTION

1. Field of the Invention

This invention relates to semiconductor processing apparatus and more particularly to improved apparatus capable of transferring wafers within an evacuated environment, or atmospheric environment, or between both environments.

2. Brief Description of the Prior Art

Semiconductor wafers are typically processed in vacuum processing systems. These systems include one or more chambers, each performing wafer processing operations such as etching, chemical vapor deposition or physical vapor deposition, which often require heating or cooling of the wafer, and a plasma to assist the process. Typically the environment within such processing chambers is maintained at a low subatmospheric pressure. Each chamber includes inlets and outlets for evacuation apparatus and the admission of processing gases, as well as an aperture controlled by a slit valve to admit wafers. Such processing chambers may in turn communicate with a wafer transfer chamber, and in turn the transfer chamber will have a valve-controlled aperture by which wafers can be admitted from outside the system.

The transfer of a wafer to and from a chamber and to and from the outside of the system is generally done mechanically by means of a robot arm at the end of which is a wafer retaining means. There are two types of wafer retaining means used in the art. The first type is a flat blade through which a vacuum channel is formed, terminating in an outlet. This is so that the blade can pick up a wafer by touching the surface containing the outlet, typically the upper surface of the blade, to the bottom surface of the wafer and applying a vacuum, so as to cause the wafer to stick to the blade. The advantage of the flat vacuum blade pickup is that the blade, being flat and thin, can be relatively easily maneuvered between the tight spaces of a wafer storage cassette to pick up a wafer.

There are two prominent disadvantages to the vacuum blade. First, since the blade pickup function relies on vacuum suction to hold a wafer in place, the blade pickup is completely ineffective for holding a wafer in an evacuated environment. Second, the construction of the vacuum blade is expensive, and the blade can break down under high temperature or corrosive conditions. The construction of the blade is typically an expensive multilayer laminate of metal and plastic bonded together with silicone rubber. These layers tend to separate or warp when contacted with a hot wafer, and the blade can corrode in the presence of corrosive wafer processing gases.

To overcome the disadvantages of the flat vacuum blade, a shoe attached to the robot arm has been used. This second prior art wafer retaining surface comprises a shoe, or tray-like extension at the leading end of the arm, having a bevelled contour shaped to accommodate a wafer. The shoe helps to engage the wafer and retain the wafer in place upon the arm while the robot arm swings around to deliver the wafer to another location.

Although the shoe is fairly effective for moving wafers in a vacuum environment, it is less effective and efficient in the ambient atmospheric environment, particularly where wafers must be transferred to and from a standard wafer cassette. One drawback is that a vacuum pick on the shoe is typically still necessary to transfer wafers from a wafer cassette. In designs in which the arm to which the shoe is attached extends to the bottom center of the blade, only the front edge to the center of the shoe has the clearance necessary to extend into a standard wafer cassette. Such a shoe typically can extend only partially into the cassette, with the tip of the shoe adjacent the bottom center of a wafer. Accordingly a vacuum suction is applied to the wafer to insure positive retrieval and retention of the wafer on the shoe as the wafer is retracted from the cassette.

In order to permit the shoe to be extended even partially into the tight spacings of a standard wafer cassette, the shoe must be machined to be quite thin. But even a thin shoe inevitably is an undesireably close fit for the tight clearances within a standard wafer cassette, even if dimensioned to extend fully within a wafer cassette to engage a wafer. And simply relying on the thin retaining projection of such a thin shoe along with gravity to engage the wafer during transit may not provide sufficient assurance that wafers will be consistently retained.

Neither may such a thin shoe provide sufficient assurance that the wafer will assume a consistent position during transit. For example, when the inner edge of the shoe comes into contact with a wafer, the edge of the wafer at one position sometimes becomes caught in the interface between the inner edge of the shoe and the shoe bottom, so that the opposite position on the edge of the wafer is lifted upward. The wafer thus rests in a canted position in the shoe rather than centered and flat. When the wafer placement on the shoe is canted, wafer positioning on the processing support surface in the processing chamber is not consistent from wafer to wafer. This in turn can lead to a multitude of processing problems, such as non-uniformity, plasma arcing, and damage to the wafer and support surface.

Although the association of a vacuum pickup feature with such a shoe may help with such problems, it is at best only a partial solution. It does nothing to enhance the function of the shoe within evacuated environments, nor the inevitable clearance problem presented in accessing a standard cassette even with a thin shoe.

There is a need therefore for a wafer transfer apparatus and method which would be equally efficient and effective both in a vacuum and ambient environment, and in transferring wafers between both environments. Also very desirable would be a wafer transfer apparatus and method that consistently assures proper holding and centering of the wafer under every condition and environment encountered during wafer transferral. Likewise very desirable would be a wafer processing system which performs in an improved manner the transfer of wafers between a standard cassette and a transfer chamber at ambient pressure, as well as the transfer of wafers between a transfer chamber when evacuated to a subatmospheric pressure and one or more evacuated wafer processing chambers. It would also be very advantageous to provide a wafer transfer device that can withstand corrosive substances and elevated temperatures. The foregoing capabilities would be still more desirable if provided with a thin profile wafer transfer device with the capability of smoothly accessing between the tight spaces of standard wafer storage cassettes, and which incorporated both a vacuum conduit and capacitive sensors.

SUMMARY OF THE INVENTION

In accordance with one aspect of the invention, a method of transferring substrates under conditions of varying pressure is provided. The method includes moving a substrate when the ambient pressure is relatively high by means of a substrate support provided with vacuum means for retaining the substrate during such movement. The method also includes the step of moving the substrate when the ambient pressure is relatively low by removably mounting to the support a substrate retainer; engaging and retaining the substrate by means of said support and retainer; and moving the retained substrate by moving the substrate support.

More particularly a method is provided of transferring substrates between a first environment at generally ambient atmospheric pressure and a second subatmospheric processing environment, via a controlled intermediate environment which may be varied between generally atmospheric pressure and a preselected subatmospheric pressure. The method includes moving a substrate from the first environment at ambient into the controlled intermediate environment by means of a substrate support provided with vacuum means for retaining said substrate during its movement into and from the intermediate environment. The substrate is positioned at an intermediate storage position within said intermediate environment. In order to move the substrate between the controlled intermediate environment and the subatmospheric processing environment, a substrate retainer is removably engaged to the substrate support. The combined substrate support/retainer assembly engages and retains the substrate at its intermediate storage position and moves the retained substrate, with the intermediate environment now at a preselected subatmospheric pressure, between the intermediate position and the subatmospheric processing environment.

In accordance with a further aspect of the invention, an apparatus is provided for moving a substrate between a plurality of stations. The apparatus includes a mechanical arm moveable between the various stations; and first and second substrate supporting devices. The first device is supported at the leading edge of said mechanical arm, and is capable of supporting a substrate alone or in combination with the second substrate supporting device. The first device includes means for securing a substrate being transported by the arm and the first device against movement relative thereto while the mechanical arm is being moved between stations at generally ambient pressure. The second substrate device is removably mountable to said first substrate retaining device, and secures a substrate while the arm is moved between stations at subatmospheric pressures.

More particularly, an apparatus is provided for accessing and processing substrates initially positioned within a primary substrate storage, such as a standard wafer cassette, located outside of and adjacent the apparatus. The apparatus includes a housing defining one or more processing chambers within its boundaries; a second substrate storage located within the housing, for example located within an intermediate transfer chamber within the housing; and means for transferring a substrate between the primary storage and the secondary storage, as well as between the secondary storage and a processing chamber. This means for transferring includes a mechanical arm and generally flat blade at the leading end of the arm. The blade includes suction means to hold a substrate during transfer between primary storage and secondary storage. The means for transferring also includes a wafer tray stored within the housing. The wafer tray is designed to be removably engageable with the blade and to hold a substrate during transfer between secondary storage and a processing chamber.

Accordingly a substrate may be transferred equally effectively regardless of whether it is to be moved within an environment at atmospheric pressure; or an environment at an evacuated subatmospheric pressure; or between both kinds of environments. When moving a substrate through the ambient atmosphere, the vacuum feature of the substrate support is activated to retain the substrate; while under subatmospheric conditions, the substrate support removably mounts the substrate retainer for positive retention of the wafer during this transferral under these conditions for which the vacuum feature would not be functional.

In the important application of semiconductor wafer processing, the method and apparatus of the present invention is equally effective in transferring wafers between a standard cassette outside the processing system; a transfer chamber, a processing chamber, despite the fact that the wafers begin their processing in a standard wafer cassette at ambient, and must be transferred into the very different subatmospheric processing environment of a processing chamber and back. The same transfer apparatus functions equally effectively in both environments, as well as that of the variable environment of the intermediate wafer transfer chamber, which must vary from atmospheric to a subatmospheric pressure compatible with that of the processing chamber, in order to permit the transferral of wafers without compromising the environment of a processing chamber.

The transfer apparatus including the blade with its suction means is designed to be very thin and optimized for extending between the narrow spacings of a wafer cassette in order to positively engage and support a wafer, with the added security of the application of suction to the wafer while transferring at ambient pressure. The wafers transferred into the transfer chamber are stored in an elevator with shelves more widely spaced than a standard cassette.

The wafer supporting tray is retrieved by the blade from a rest position inside the transfer chamber when transferring wafer under evacuated or subatmospheric conditions. The tray and blade are configured with respect to each other to form an interlocking assembly when the blade engages and lifts the tray. The tray/blade assembly is configured to match a wafer and positively retain same when moved under a wafer within the storage elevator and transferring that wafer between the transfer chamber and a processing chamber.

The tray can then be much thicker than the blade itself, and optimized to have a size, contours, and significant retaining structure to insure that wafers transferred under evacuated conditions are retained in a very positive and consistent manner, and as effectively as when the blade itself is working alone to transfer wafers at ambient pressure. Likewise, the construction and design of the blade is not compromised by the need to consider the transfer of wafers under subatmospheric conditions.

In fact, the blade can be optimized as a thin flat ceramic for optional maneuvering between tight wafer shelf clearances of a cassette and for resistance to high temperatures, corrosive environments, and for strength. The blade can also include capacitor sensors to aid in the control of wafer transfer motions.

DETAILED DESCRIPTION OF THE PREFERRED EMBODIMENTS

Figure 1:
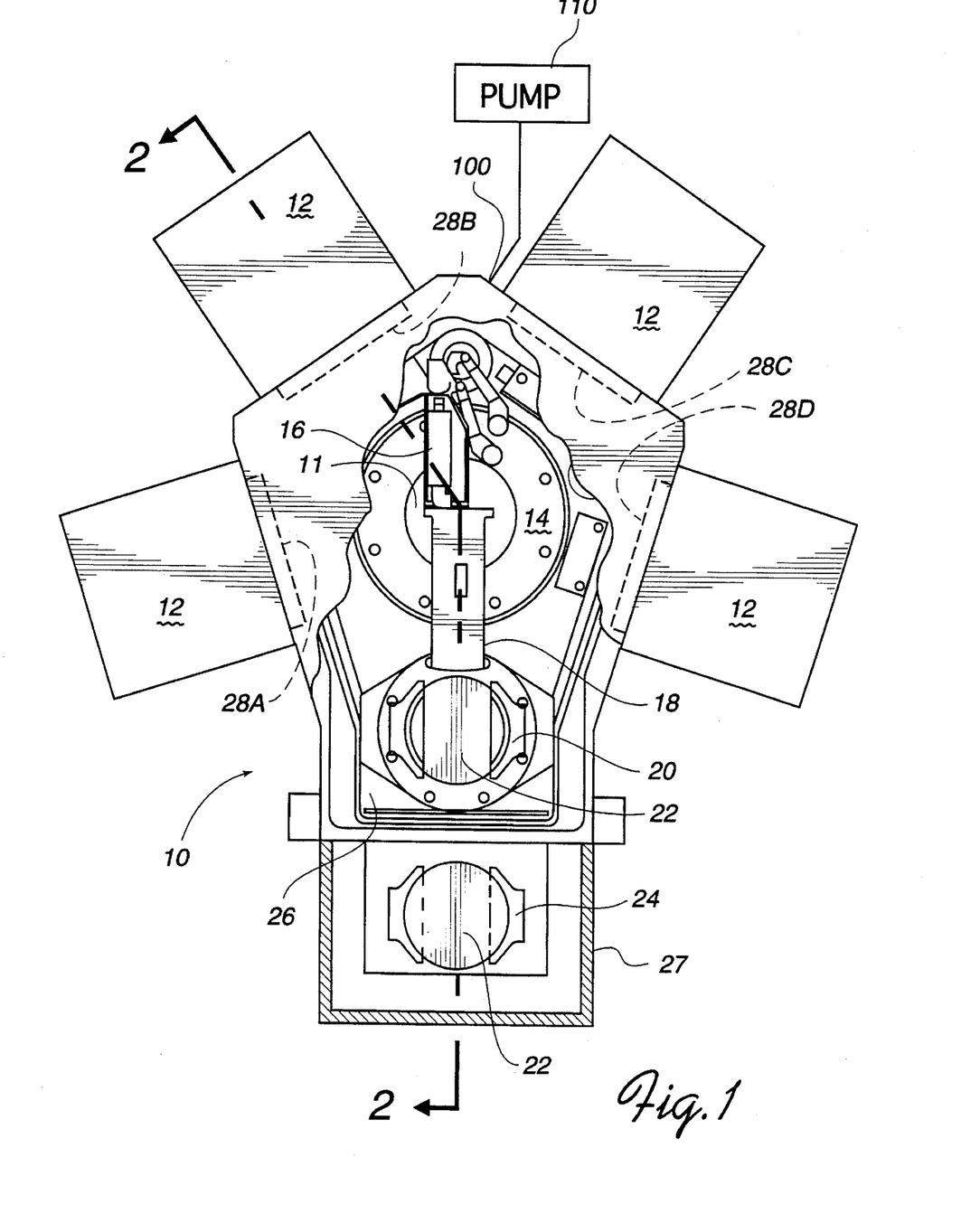
FIG. 1 is a plan view of a wafer processing apparatus including four processing chambers, and a central wafer transfer chamber with its top plate partially cut away to show a wafer transfer arm assembly within the transfer chamber.

FIG. 1 generally shows a wafer processing system 10 including four wafer processing chambers 12 and a central wafer transfer chamber 14 into which wafers 22 are transferred from a standard cassette 24. The cassette is positioned outside and adjacent transfer chamber 14 within a protective laminar flow hood 27 at generally ambient atmospheric pressure.

To accommodate the transfer of wafers into and from transfer chamber 14, a slit opening is provided in a wall of chamber 14 spaced from processing chambers 12 and adjacent hood 27. A slit valve 25 of conventional design controls the slit opening in the wall of the transfer chamber. Slit valve 25, when closed, seals the chamber 14 from the ambient environment and from the laminar flow hood 27. Each processing chamber 12/transfer chamber 14 interface likewise involves a slit opening similarly controlled by respective slit valves 28A, 28B, 28C, and 28D.

As FIGS. 2 and 3 together with FIG. 1 generally show, transfer chamber 14 is provided with a wafer transfer arm assembly 11 to effect this transferral of wafers, whose novel features will be discussed below, but which generally includes a robot arm 16, a flat wafer carrying blade 18 provided at the leading end of the robot arm 16, and a removable wafer supporting tray 40. Robot arm 16 moves only within a horizontal plane, but can extend forward from an elbow and is further capable of swinging around in a 360 degree arc, while also maintaining any wafer being transported in a horizontal plane.

Figure 2:
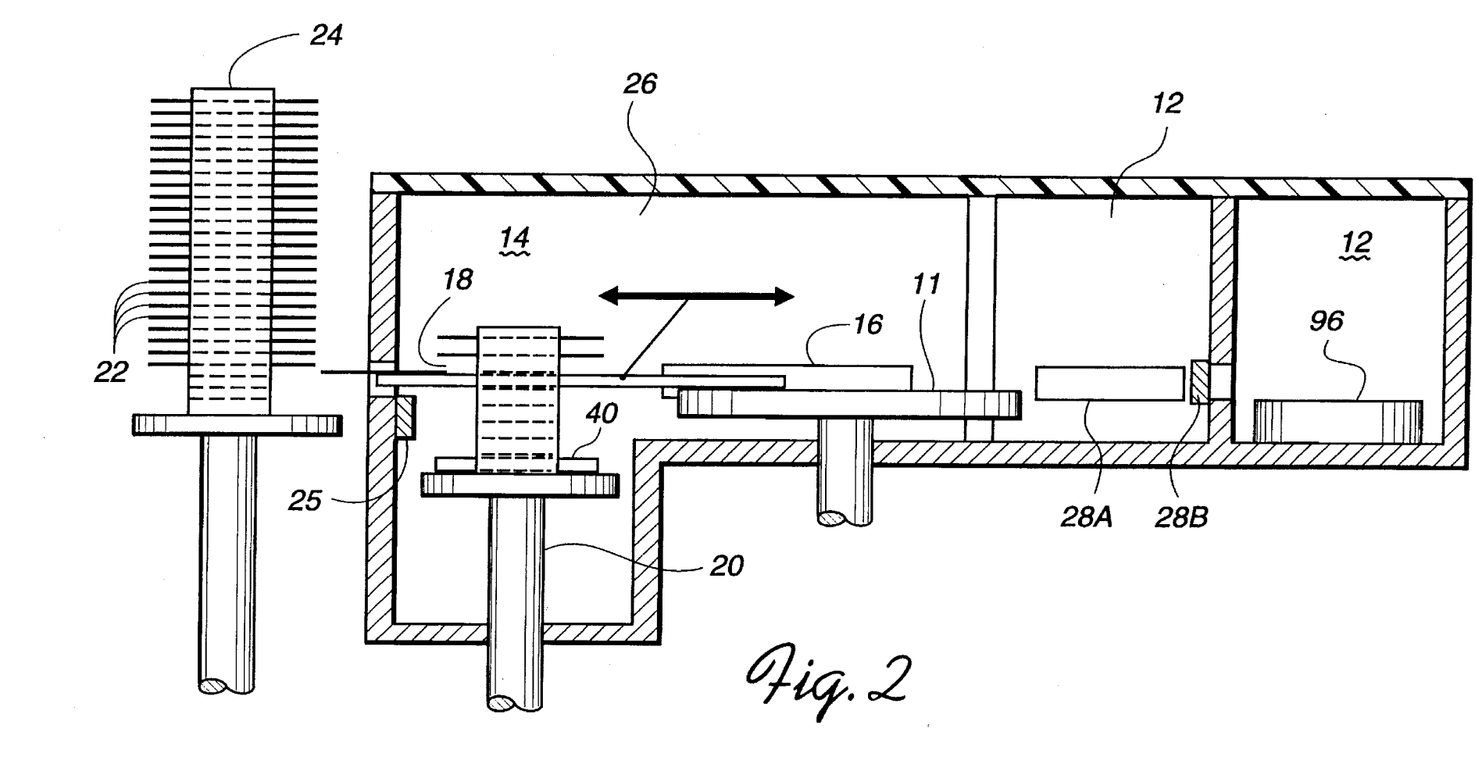
FIG. 2 is a side sectional view taken along line 2 of FIG. 1 of the central wafer transfer chamber, showing an intermediate wafer storage elevator inside the loadlock area; a slit valve defining a controlled aperture between the internal chamber environment and a wafer storage cassette external to the transfer chamber; and also showing the transfer of wafers by the wafer transfer arm assembly between the intermediate wafer storage elevator and the external wafer cassette along the indicated direction.
Figure 3:
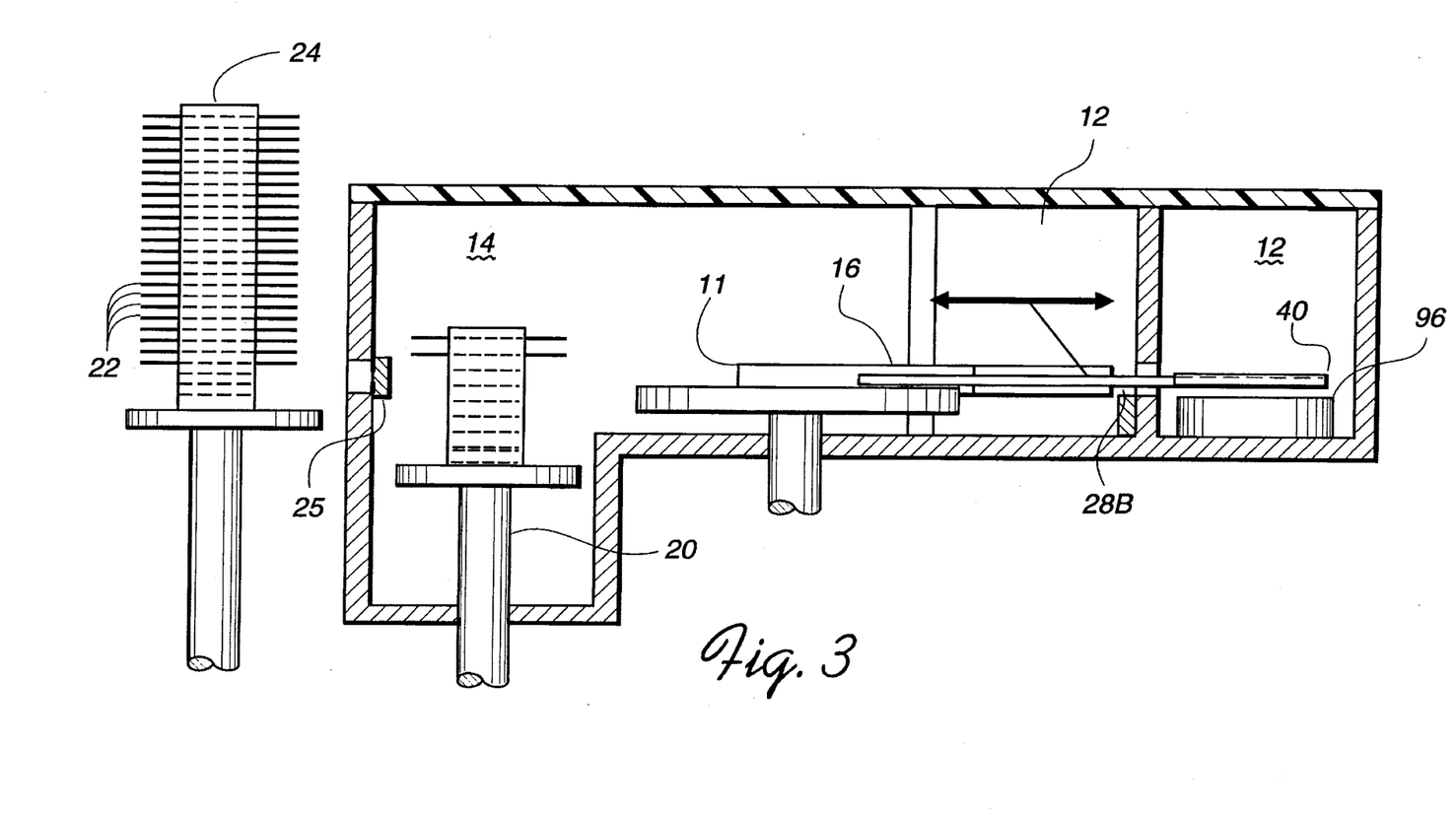
FIG. 3 is a view similar to FIG. 2, showing the transfer of wafers by the arm assembly between the wafer storage elevator and a wafer process chamber.

FIG. 2 shows this transferral of wafers between cassette 24 and transfer chamber 24, while FIG. 3 shows the transferral of wafers between transfer chamber 14 and one of the processing chambers 12. The processing chambers are continually kept at typically near-vacuum subatmospheric pressure in accordance with typical wafer processing environments such as for etching, chemical vapor deposition or physical vapor deposition. However, transfer chamber 14 may be either at atmospheric or at a low pressure comparable to that of a processing chamber 12. When wafers are being transferred between cassettes 24 and chamber 14 as in FIG. 2, transfer chamber 14 is at generally ambient pressure (chamber 14 preferably is also vented just prior to such transferrals to help in equalizing chamber pressure with ambient). Slit valve 25 is open, and meanwhile valves 28A–28D remain closed, to protect the subatmospheric processing environment of the processing chambers.

Once the transfer of wafers from cassette 24 into transfer chamber 14 has been completed, slit valve 25 is closed, chamber 14 is pumped via a pumping port 100 and pump 110 down to a subatmospheric pressure similar to that of the processing chambers while slit valves 28A–28D remain closed. Once the pumping of transfer chamber 14 is completed to the proper subatmospheric pressure, wafers can then be transferred between the processing chamber 12 and transfer chamber 14. Slit valves 28 are then opened to permit the transfer of wafers between transfer chamber 14 and the processing chambers, as illustrated in FIG. 3.

FIGS. 2 and 3 in conjunction with FIG. 1 also generally show the action of robot arm 16, in particular blade 18 and tray 40 in moving wafers about system 10. Flat blade 18 moves wafers, by means of an integral vacuum pick (which will be described in detail below), through slit valve 25 between wafer cassette 24 and an intermediate wafer storage elevator 20 (also illustrated in partial perspective in FIGS. 4 and 5) inside chamber 14. The position of elevator 20 adjacent valve 25 and spaced from chambers 12 is best appreciated from FIGS. 1 and 2. Upon closure of slit valve 25 to isolate transfer chamber 14 from the ambient, and pumpdown of the transfer chamber to an evacuated subatmospheric pressure, blade 18 is moved into removable engagement with tray 40, and both are utilized as a unit to securely engage and support wafers within the now-evacuated environment. In particular, as shown in FIG. 3 the blade/tray combination moves wafers between storage elevator 20 within the now-evacuated transfer chamber and the evacuated subatmospheric processing chambers.

Control, coordination and drive means for the slit valves, chambers evacuation, robot arm, and wafer storage elevator are well known in the art and need not be described in detail. The blade is provided with capacitative sensors as will be described below, which are utilized in a known manner to sense the proximity of a wafer or of the elevator, and to provide corresponding signals to guide such control means.

Figure 5:
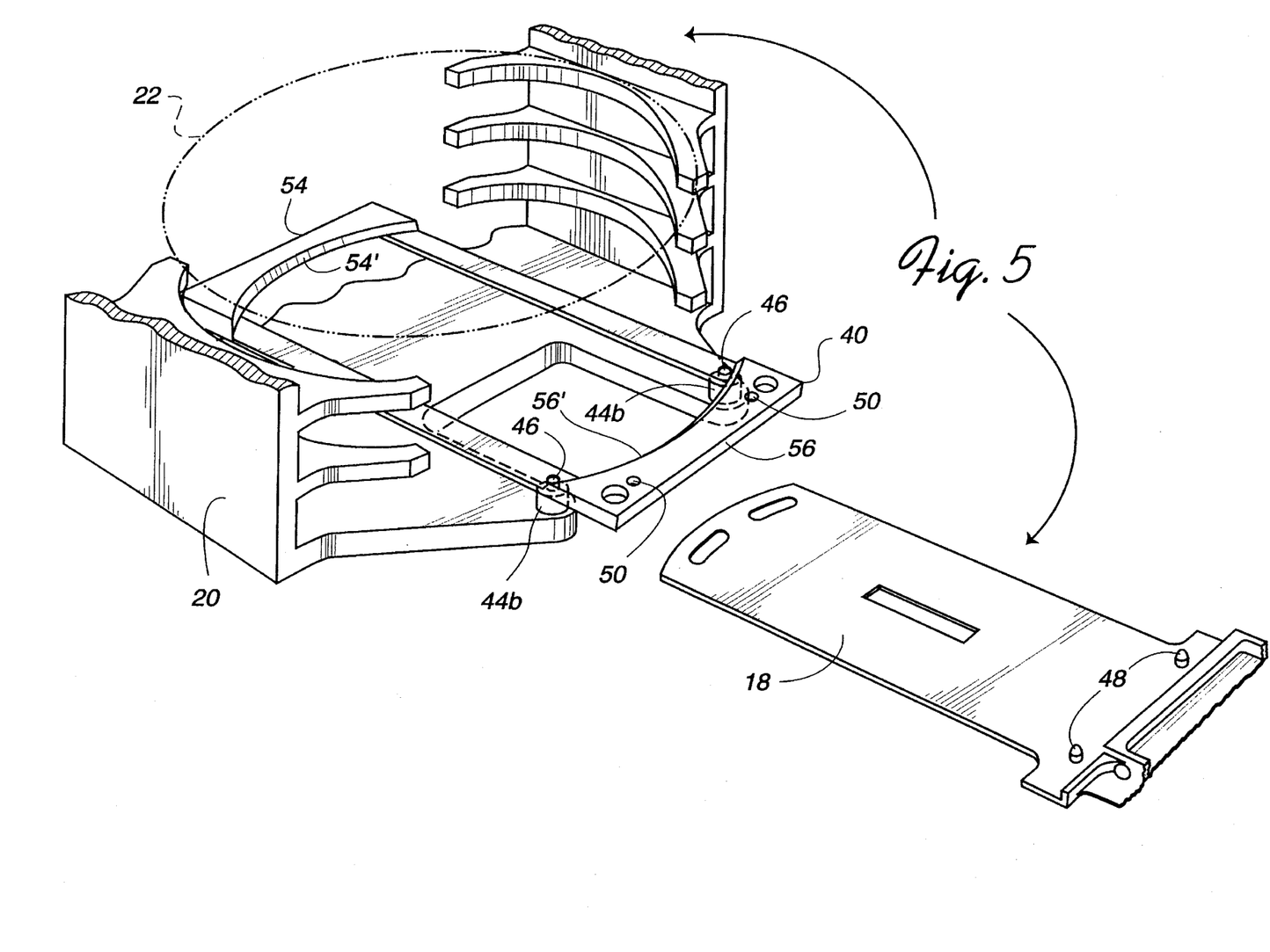
FIG. 5 is a view similar to FIG. 4 showing the wafer support tray and a wafer stored upon the intermediate storage elevator.
Figure 6:
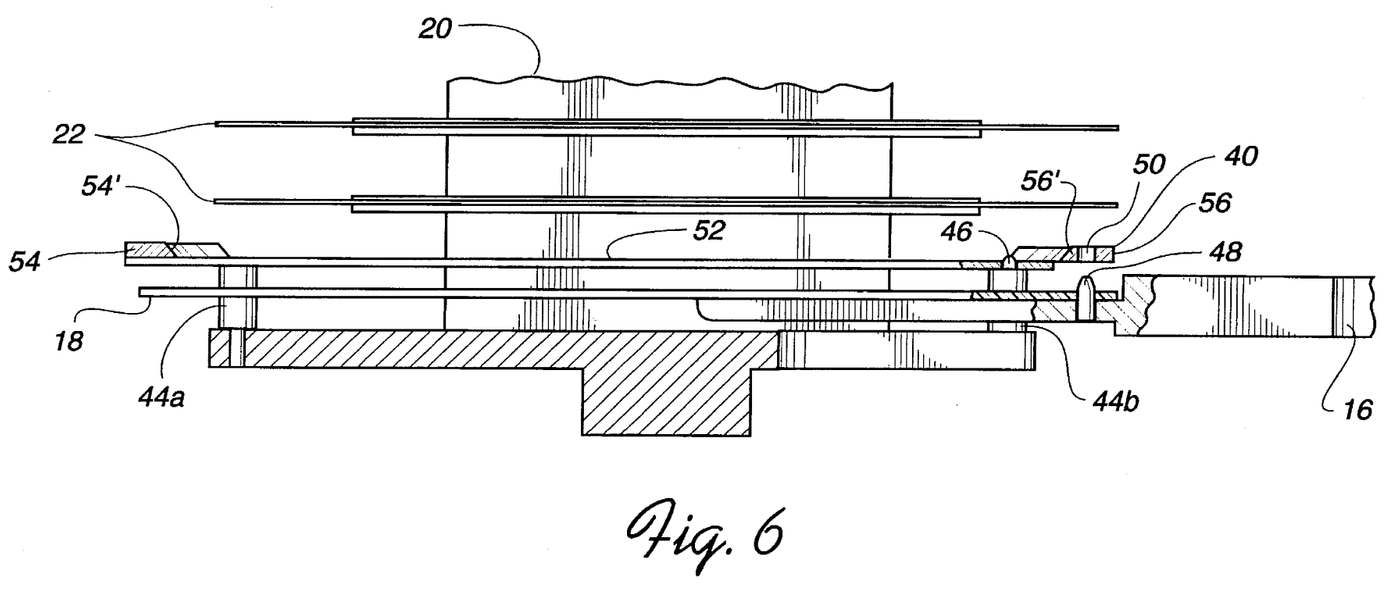
FIG. 6 is a side view through the intermediate wafer storage elevator showing the blade in position to lift the wafer tray from its rest position on the elevator, as well as showing wafers in position on shelves within the elevator.

Turning now to the specifics of wafer transferral in system 10 in complete detail, individual ones of wafers 22 are stored temporarily at respective vertical shelf positions defined in elevator 20 and as shown in FIGS. 2, 5 and 6 while in transit between the outside environment, in this case cassette 24, and one of the processing chambers. The storage elevator 20 is moved vertically up and down to align its various shelf positions with the blade. When first loading system 10, wafer cassette 24, which has been preloaded with a number of the semiconductor wafers 22, is moved into position just outside the loading area 26 within laminar flow hood 27 by a conventional cassette transport means (not shown) which is capable of moving wafer cassette 24 vertically up and down, as well as from side to side. At this time the robot arm is in a resting position whereby the leading end of blade 18 is retracted from storage elevator 20 and is aligned with slit valve 25.

In the illustrated preferred embodiment and as best shown in FIGS. 1 and 2, elevator 20 is located in the path of movement of blade 18, so that blade 18 passes through a shelf position of elevator 20 in its path to and from cassette 24. This presents no difficulty and is indeed advantageous. As illustrated in the detail FIGS. 4 and 5, the spacing between respective shelf positions of elevator 20 is appreciably greater than the thickness of the thin blade, and also greater than the spacing between shelf positions of cassette 24, so that the blade can move horizontally without risk of interference with elements of the elevator or of the cassette. At the same time, the time and blade travel necessary to move a set of wafers between the elevator and the cassette is minimized.

Figure 7:
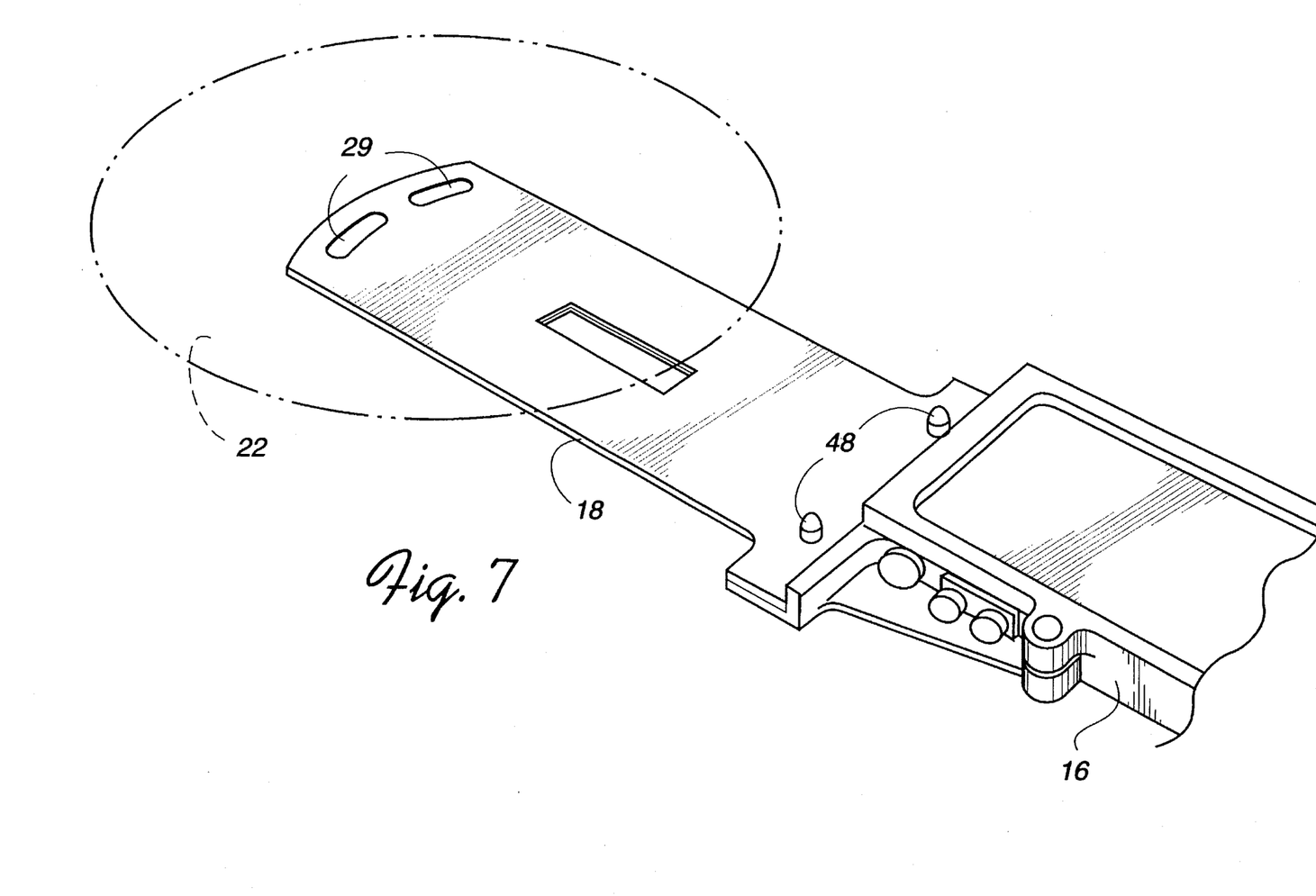
FIG. 7 is a perspective view of the blade, and showing how a wafer is positioned on the blade.

Once the blade is adjacent a wafer within cassette 24, a vacuum pick comprising one or more vacuum ports 29 adjacent to the distal end of the blade as illustrated in FIG. 7 applies suction to the blade. The cassette 24 is then lowered so that the wafer is lifted by the blade 18 clear of its shelf supports in the wafer cassette 24. With the wafer then securely held to the blade by vacuum suction, the robot arm then retracts as best shown in FIG. 2 to remove the wafer from the cassette 24 through open slit valve 25 to a position inside the transfer chamber 14 in registration with a shelf position of elevator 20. The wafer elevator then moves up to lift the wafer from the blade 18, whereupon the vacuum holding the wafer to the blade is also released, and the blade is free to again move horizontally between shelf position of elevator 20. The robot arm 16 moves the blade back towards the cassette 24 in order to transfer another of wafers 22 in the same manner from the cassette 24 to the elevator. This transfer process is repeated until all the wafers are transferred from the preloaded wafer cassette 24 to the wafer elevator 20. Of course this process is reversible, and blade 18 can with the aid of its vacuum pick engage wafers at each shelf position of elevator 20 and return same to shelf positions of cassette 24.

Because the transfer of wafers between the laminar flow hood 27 and the transfer chamber 14 through the slit valve 25 is performed at substantially atmospheric pressure, the vacuum suction feature of the blade renders unnecessary any other wafer securing expedient, including the tray. An advantage of using only the blade to support wafers to and from the wafer cassette 24 is that the blade, being thin, can more easily maneuver within the tight spacings between wafers in the cassette.

As can be seen from FIG. 7, the wafer is supported with its center point on the tip (distal end) of the blade. All that is required to keep the wafer on the blade is a suction applied at the interface between the blade and the wafer. The constructional details of the vacuum pick of the blade which provides the suction is described below with reference to FIGS. 10 to 12. Once elevator 20 has been loaded with wafers from cassette 24, the blade 18 is retracted into transfer chamber 14, slit valve 25 is closed to seal off transfer chamber 14 from the outside environment, and transfer chamber 14 is pumped down to a predetermined subatmospheric pressure, with both this pressure, and preferably the composition of the environment within the transfer chamber 14 being controlled to be compatible with that of one of the processing chambers 12A–D to which a wafer is to be transferred.

Figure 4:
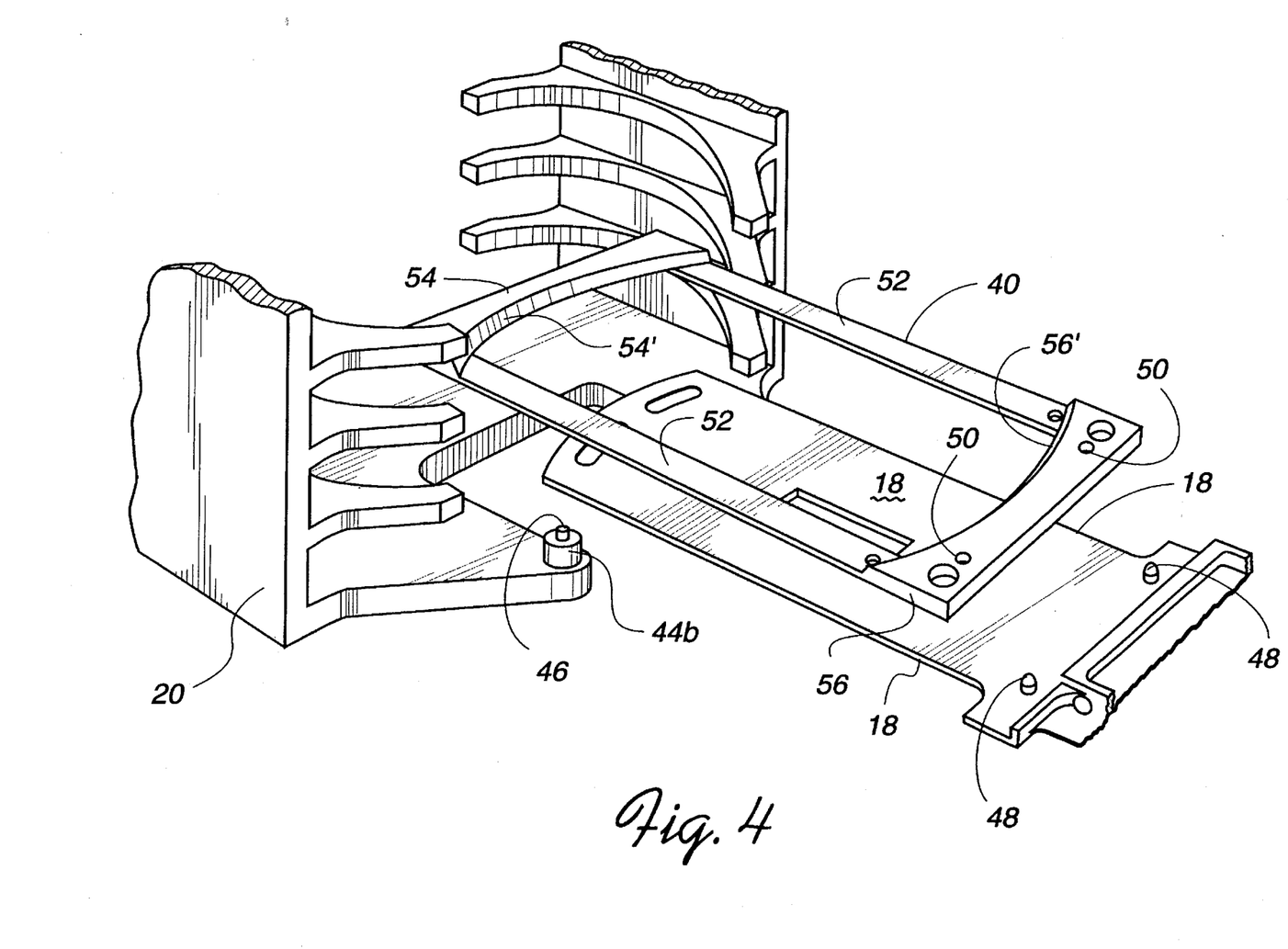
FIG. 4 is a perspective view of the intermediate wafer storage elevator and an exploded view of the leading end of the wafer transfer arm assembly, including a wafer transfer blade and removably engageable wafer support tray in accordance with the invention, as well as the cooperation between these elements.
Figure 8:
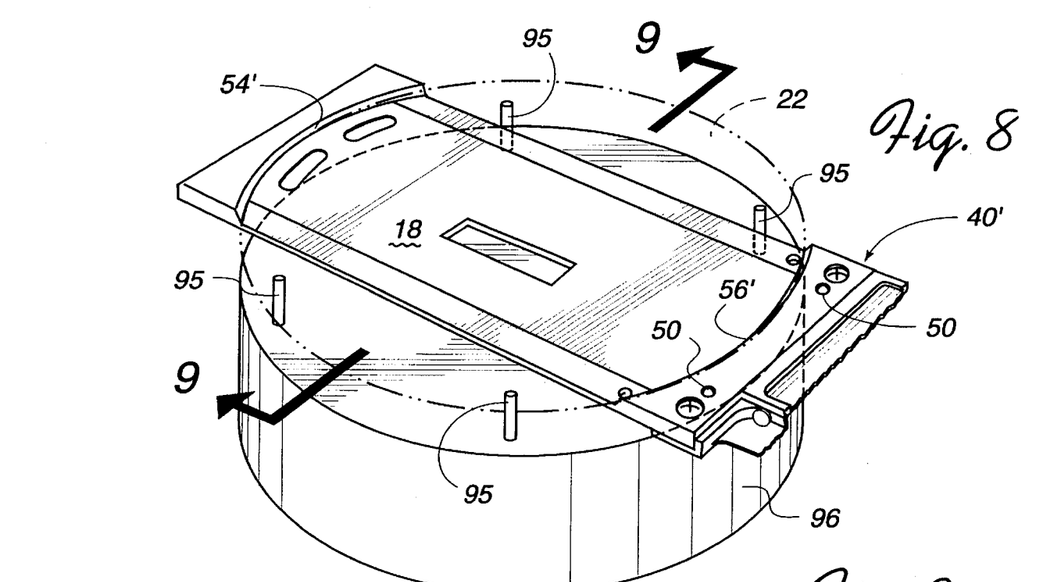
FIG. 8 is a perspective view of the blade with tray attached and placing a wafer above a wafer support pedestal inside a processing chamber with the wafer in phantom, and with wafer support pins extending from the pedestal to lift the wafer from the blade tray.

It will be noted that the wafer must now be moved between the transfer chamber 14 and a processing chamber 12, both of which are now evacuated environments at typically near-vacuum subatmospheric pressures; again, this movement is generally shown in FIG. 3. Clearly, the vacuum pick which served so well to secure the wafer as it was being moved from ambient pressure into the transfer chamber when the transfer chamber was also at ambient will no longer work in such evacuated environments. Accordingly, vacuum suction is not applied to the blade or wafer during wafer transfer with the evacuated environment; rather, the robot arm 16 now engages blade 18 with a removable tray 40. When not in use, tray 40 is stored in a bottom location on storage elevator 20. FIG. 4 illustrates the complimentary interlocking portions of the blade and tray; the particulars of their interlocking relationship will be discussed in more detail below. FIG. 5 shows the tray in its rest storage position on the lowermost shelf of elevator 20. FIG. 8 best illustrates the engaged tray-blade combination 40'.

The robot arm 16 operates to position the blade/tray 40' under a selected wafer 22 in the elevator as best shown in FIG. 6. As we have noted, elevator 20 holds the individual wafers stored therein upon respective shelves, each with greater separation than exhibited by corresponding shelves of the standard cassette 24, and with enough separation to accommodate passage of tray/blade 40' with wafer. Each wafer on the elevator is therefore easily accessed and removed by the blade/tray combination. The elevator 20 is moved downwards until the wafer 22 comes to rest on the blade/tray 40'. The wafer is then lifted off the elevator shelf by blade/tray 40. As best seen in FIG. 6, the tray edges are shaped to match the curvature of the wafer, and are sloped inward, to enable a slightly offset wafer to slide into a centered position within the tray, and further to secure the wafer against slippage during movement.

Figure 9:
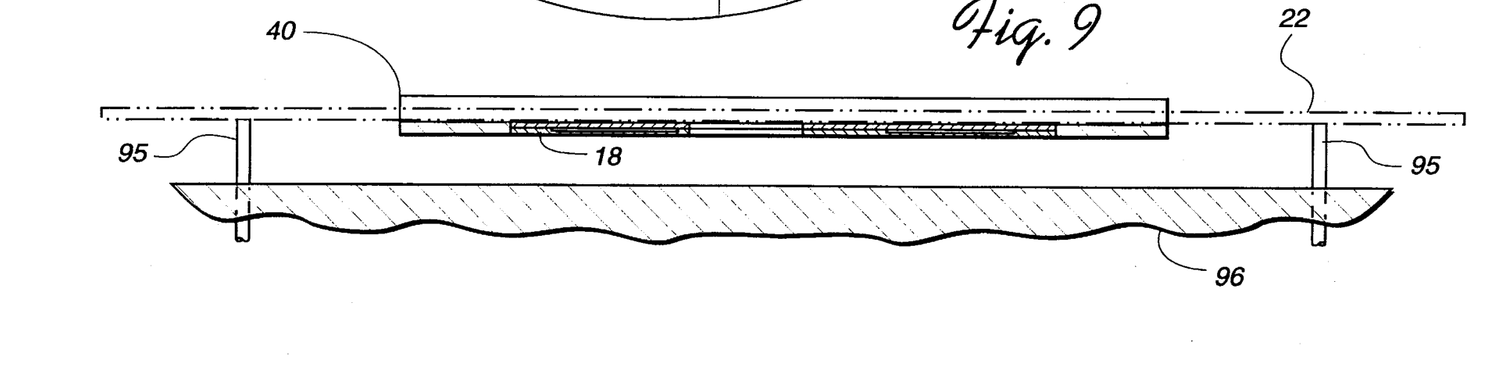
FIG. 9 is a side sectional view taken across line 9—9 of FIG. 8 of the wafer transfer arm assembly, in position centrally over a wafer support pedestal within a processing chamber including a blade and removable wafer tray, with the tray supporting a wafer shown in phantom, and with wafer support pins extended from the pedestal to engage the wafer.

As illustrated by FIG. 3, the robot arm 16 then moves the blade/tray 40' and its accompanying securely-held wafer 22 into position toward a preselected one of processing chambers 12A–D. The appropriate one of slit valves 28A–D (28B in FIGS. 2 and 3) is opened, and the robot arm then moves the blade/tray 40' with wafer 22 into the chamber 12 directly above and centered over wafer support plate 96. As illustrated in FIGS. 8 and 9, two pairs of pins 95, which are spaced a distance wider than blade/tray 40', move upward to lift wafer 22 off blade/tray 40'. Robot arm 16 retracts, and pins 95 are lowered into plate 96, so that wafer 22 rests in a centered position atop plate 96. Because each wafer is properly centered in blade/tray 40', each wafer is accurately centered with assurance on the wafer support plate for repeatable processing. The blade/tray 40' then is withdrawn from the chamber 12, and the chamber slit valve 28 is closed. Thereupon wafer processing, such as chemical vapor deposition or etch, commences within the processing chamber.

When wafer processing has been completed, the slit valve 28B is opened, wafer 22 is lifted upward by pins 95, the robot arm 16 moves the blade/tray 40' into the chamber 12 to a position underneath the now-processed wafer 22, and removes the wafer from the processing chamber through the slit valve 28. The robot arm 16 may then move the wafer 22 into another processing chamber 12 or it may return the wafer to the elevator 20. Eventually, however, the wafer completes its assigned processing steps and the wafer must be returned to elevator 20, which rises upwards to lift the wafer 22 off the blade/tray 40'.

In moving a subsequent wafer to the processing chambers, the blade/tray 40' is then withdrawn into transfer chamber 14, and elevator 20 is positioned so that the blade/tray 40' can be moved into position under the subsequent wafer in the elevator 20. Once again the elevator 20 moves slightly downwards to bring the wafer in contact with the blade/tray 40' (i.e., until the wafer is lifted off its supports by its lower face catching on the blade/tray while the elevator moves downward) so that the robot arm 16 can remove the wafer from the elevator 20 and insert it into a second processing chamber 12. Note that at all times during this transfer process the slit valve 25 is kept shut and an evacuated environment is continuously maintained inside the transfer chamber 14.

The above process of transferring wafers using the blade/tray combination between the transfer chamber 14 and processing chamber 12 through one of slit valves 28 is continued until all the wafers have been processed and returned to the elevator 20. At this time the wafers are ready for transfer back to the cassette 24. The blade/tray 40' moves toward the tray storage position situated on the elevator 20 and reverses the procedure of depositing wafers on the elevator. The elevator moves upward to lift the tray 40 off the blade and into its storage position. Keeping the slit valves 28 and 25 closed, the transfer chamber 14 is vented to approximately match the pressure of the laminar flow hood 27. When the pressures of the transfer chamber 14 and the laminar flow hood 27 have equalized, slit valve 25 opens, and the robot arm 16 with blade 18 only transfers the wafers from the elevator 20 to the cassette 24 using the vacuum suction feature of the blade to hold the wafer in place while the robot arm 16 is in motion. This process is essentially similar to, but the reverse of, the original cassette-to-elevator transfer process described above.

The details of the removable engagement of wafer tray with blade 18 are best appreciated with the aid of FIGS. 4–6. When the tray 40 is not positioned on the blade as a blade/tray combination 40', the tray is positioned at the base of the elevator 20 on two pairs of positioning pins 44a and 44b as in FIG. 5. The leading or distal positioning pins 44a each have a flat topped surface on which the tray 40 rests. The proximal pins 44b, however, act as centering pins and each have a protrusion 46 formed on its top. These protrusions 46 fit into complementally sized sockets formed into the bottom of the tray. As a result of this configuration the tray always is caused to rest in the same lowest shelf position when supported on the base of the elevator 20.

As can be seen from FIG. 4, the tray 40 includes distal and proximal ends, 54 and 56 respectively, both of which have semicircular cutouts with sloping faces 54', 56' formed therein. These semicircular cutouts are sized to be approximately equivalent to the wafer size and to follow the curvature of a wafer. As shown in FIG. 6, the physical construction of the tray 40 allows the tray to receive the semiconductor wafer 22 as the elevator moves downward, and automatically center the wafer in the tray by enabling a slightly offset wafer to slide down the sloping faces into place. Since the wafer is positioned inside the raised distal and proximal ends, the wafer is held in place when the robot arm 16 moves.

Before the transfer of wafers from the elevator to the processing chambers 12 commences, the blade 18 is inserted underneath the tray 40 as shown in FIG. 4. The blade 18 has a pair of centering pins 48 near where the blade 18 is connected to the wafer robot arm 16. These pins 48 are sized to fit into sockets 50 in the tray 40 and, in so doing, ensure that the tray 40 is correctly positioned on the blade 18. As illustrated in FIGS. 4 to 6, to further ensure this positioning, the tray 40 has its long sides 52 designed to receive the blade 18 between them so that they overhang the blade 18 and keep the tray 40 in position. Once the blade 18 has been positioned under the tray 40 so that the centering pins 48 are directly underneath the sockets 50 of the tray, the elevator 20 is moved downwards until the tray 40 is engaged by the blade 18 and is raised clear of its supporting pins 44a and 44b. The happening of this event is sensed by means of capacitive sensors within blade 18, the configuration of which will be described further below with reference to FIGS. 10 and 11.

When processing has been completed and the wafers have been moved back to storage elevator 20, robot arm 16 moves blade/tray 40' to its storage location at the lowest shelf of storage elevator 20 and deposits tray 40 thereon.

Figure 10:
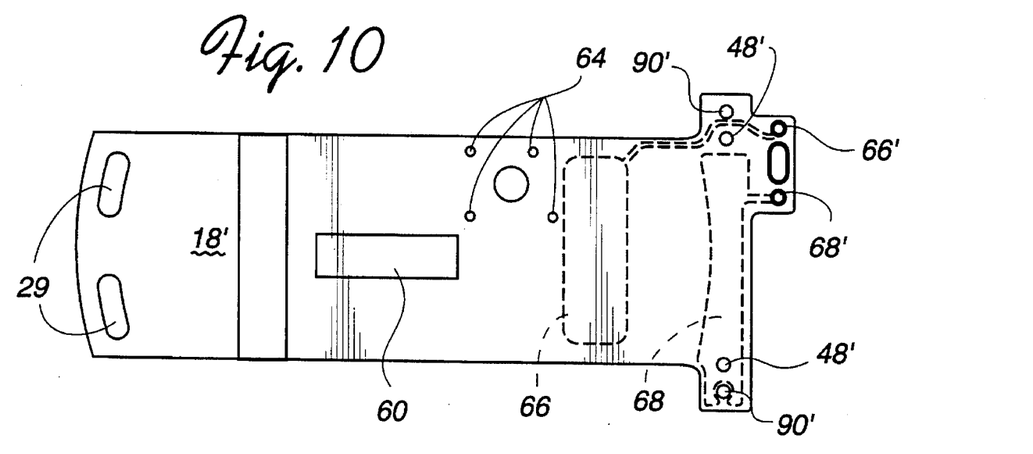
FIG. 10 is a plan view of the upper half of the blade of the arm assembly.
Figure 11:
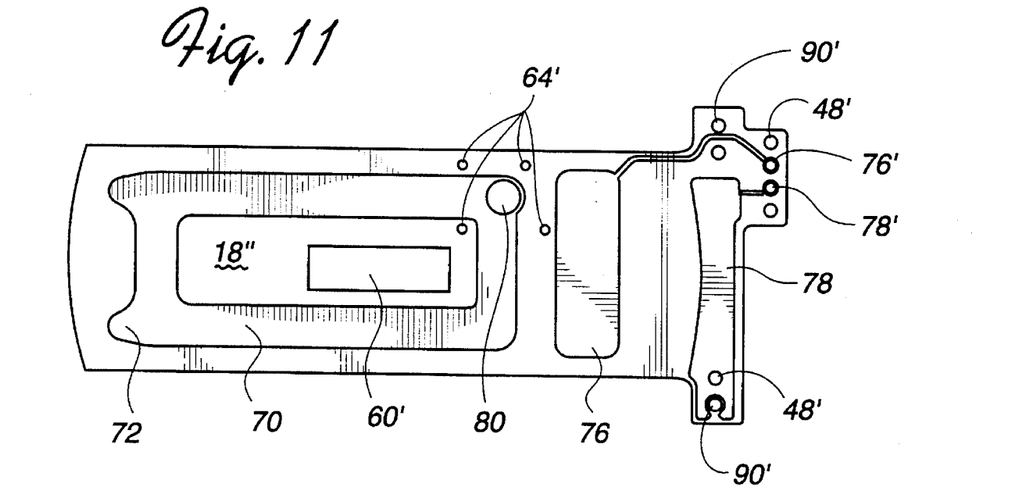
FIG. 11 is a plan view of the lower half of the blade of the arm assembly.
Figure 12:
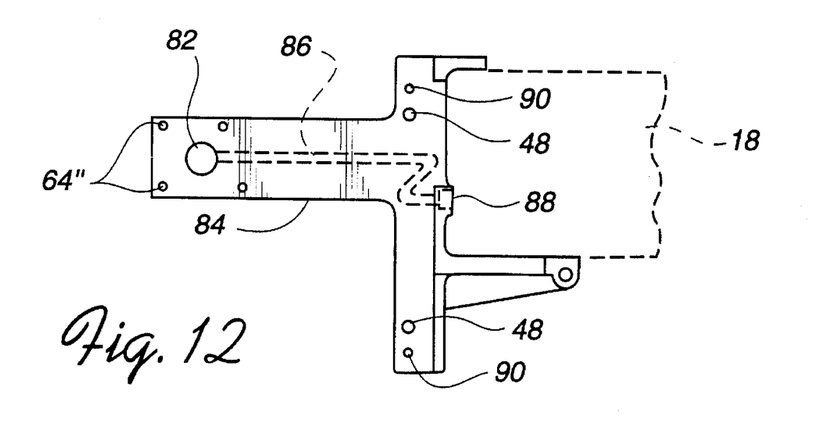
FIG. 12 is a plan view of a supporting T-bar of the arm assembly, by means of which the blade is attached to the robot arm of the arm assembly.

The constructional details of the two part ceramic blade 18 are more fully given in FIG. 10 which shows the upper half of the blade, FIG. 11, which shows the lower half of the blade, and FIG. 12 which is a plan view of a supporting T-bar which is located underneath the blade 18 and which connects it to the robot arm 16.

The upper half 18' of the blade 18 as shown in FIG. 10 is constituted preferably by an alumina ceramic plate. The central portion of the blade has a rectangular hole 60 formed therethrough and at the blade's leading end two oblate apertures 29 are formed through it. The purpose of these apertures will be described later with reference to FIG. 11. Also shown are four countersink holes 64 formed through the upper half of the blade 18'. In addition, this figure shows two generally rectangular shaped electrodes 66, 68 formed thereon by a gluing and firing process, which terminate in electrical connectors 66' and 68' respectively. Each of these two rectangles 66, 68 defines the upper half of a capacitive sensor, one of which is used to determine whether or not the tray has been engaged by the blade, and the other of which is used to determine whether or not the wafer has been engaged by the blade.

In FIG. 11 the lower half 18" also made of alumina ceramic, is shown to include an aperture 60' corresponding to the aperture 60 shown in FIG. 10. In addition, holes 64', corresponding to holes 64 in FIG. 10, pass through the blade lower half 18". This figure also shows a vacuum channel 70 which has been formed in the surface of the blade lower half 18". At the one end of the generally rectangular shaped vacuum channel, two extensions 72 are formed.

When the upper half 18' of the blade 18 is placed onto the lower half 18" of the blade, the rectangular apertures 60 and 60' are in registration with one another to define an aperture which passes through the blade 18. Similarly, the holes 64 and 64' are in registration with one another to permit fastening screws (not shown) to pass through them so that the blade can be secured onto the mounting T-bar illustrated in FIG. 12. When the two halves of the blade are placed together, the extensions 72 lie directly below the oblate apertures 29. As a result the vacuum channel 70 is able to communicate directly with the upper surface of the blade 18 so that, when a wafer is received thereon and a vacuum is applied in the channel 70, this vacuum can be transferred to the interface between the wafer and the blade 18.

The upper and lower halves of the blade are sintered together to form a thin blade of approximately 0.050" of high strength and ability to withstand potentially high wafer temperatures. A thin blade is desired because it can more easily move within the clearance between wafers on a standard cassette, which can be as little as approximately 0.20" (5 mm) wide.

FIG. 11 also shows two generally rectangular shaped electrodes 76, 78 which correspond in size and position to the similarly-shaped electrodes 66 and 68 shown in FIG. 10. These pads 76, 78 are the lower halves of the two capacitive sensors which are respectively used to determine whether or not the wafer tray 40 or the wafer 22 itself has been loaded onto the blade.

The upper pad 66 has the same area and shape as its corresponding pad 76. The same applies to the upper pad 68 and its corresponding pad 78. When the upper and lower halves of the blade 18 are sintered together, their respective electrodes are separated by about 0.001" (25 μ). This means that two capacitive sensors, one defined by pad 66 and pad 76 and the other by pad 68 and pad 78, are formed in the assembled blade. It should be noted that these capacitive sensors are not contact sensors, but rather operate to determine a change in capacitance as the blade and the wafer tray (or blade and wafer) move closer together. The sensors are calibrated so that they signal the presence of a wafer or the tray only when the wafer or tray are properly centered on the blade.

Finally, FIG. 11 shows a circular hole 80 formed through the lower half 18" of the blade 18. This hole 80 provides a direct communication port between the vacuum channel 70 and a similarly sized hole 82 formed partway into the T-bar 84 illustrated in FIG. 12. The hole 82 in the T-bar 84 is connected to a vacuum source (not shown) by means of a conduit 86 and a vacuum port 88. This vacuum port communicates with the vacuum source through a channel formed in the robot arm 16, which is shown in broken lines in this figure. The T-bar is also shown to include four threaded holes 64". These threaded holes correspond to the holes 64 and 64' shown in FIGS. 10 and 11 and receive fasteners which pass through the upper and lower blades 18' and 18" to secure the blade 18 onto the T-bar 84. As can be seen from this figure the T-bar has the centering pins 48 mounted on it. These pins pass directly through apertures 48' formed in both the upper and lower halves of the blade 18 to protrude beyond it. In addition, FIG. 12 shows two studs 90 protruding vertically upward out of the T-bar 84. These studs fit into holes 90' formed in the upper and lower halves of the blade 18 and act to center the blade onto the T-bar when the T-bar and the blade 18 are being secured together by means of the screws passing through apertures 64.

Conventional wafer carrying blades, which are made of plastic, metal and/or silicon, cannot achieve the great thinness of the present blade, as these previously used materials lose their structural strength under the high-heat operating conditions of the wafer processing reactors. It is only with the use of materials such as alumina ceramic, which have high structural rigidity even under high temperatures, that a blade can be made as thin as the blade of the invention (typically approximately 0.05").

The carrying blade and tray combination of this invention has a number of further important advantages over the prior art devices. Since the tray is removable, a trayless thin blade with vacuum suction can be used for transferring wafers between the cassette and elevator. As a result, it enables reliable wafer transfer despite the small gaps between the wafers in the cassette. Then, when wafer transfer within an evacuated environment is required, thereby precluding the use of vacuum suction on the blade, the tray can be easily interlocked with the blade for reliable, slip-free wafer transfer within a vacuum environment. Although not necessary for the practice of the other aspects of the invention, the desirable two part ceramic construction of the blade is much easier and cheaper to fabricate than earlier blades and, once in use, the blade retains its structural strength and its different halves do not separate from one another.

While the invention has been particularly shown and described with reference to certain preferred embodiments, it will be understood by those skilled in the art that various alterations and modifications in form and in detail may be made therein. Accordingly, it is intended that the following claims cover all such alterations and modifications as may fall within the true spirit and scope of the invention. It should also be noted first that although the invention is described in the context of semiconductor wafers, this invention is not limited to use with semiconductor wafers; rather, it envisions use with any and all substrates which are relatively flat and are to be transferred and held in both ambient and evacuated environments.

We claim:

1. A composite ceramic blade for holding a substrate, wherein said blade is operable under differing pressure environments, wherein said blade can withstand substrates of varying temperature, comprising:

(a) an upper ceramic layer having an upper and a lower surface;

(b) a lower ceramic layer having an Upper surface permanently attached to said lower surface of said upper ceramic layer;

(c) at least one integral passageway formed in either said lower surface of said upper ceramic layer or said upper surface of said lower ceramic layer;

(d) a port defined in and extending through at least one of said layers and in communication with said at least one integral passageway for transmitting a vacuum to said integral passageway;

(e) one or more apertures in said upper ceramic layer adjacent to a leading end of said blade and extending from said upper surface of said upper ceramic layer through said upper ceramic layer to said integral passageway, and spaced from said port to thereby provide a vacuum at said one or more apertures, so as to render said blade capable of retaining a substrate placed over said one or more apertures; and (f) one or more sensors including electrode zones defined on at least one of said ceramic layers for sensing the presence or nonpresence of a substrate.

2. The apparatus as recited in claim 1, wherein said upper ceramic layer of said ceramic blade has said port formed therethrough and said upper surface of said lower ceramic layer contains said at least one integral passageway formed therein whereby, when said upper and lower ceramic layers of said ceramic blade are joined together, said port communicates with said passageway to permit a suction to be communicated via said passageway and port to said apertures beneath a substrate supported on said blade.

3. The apparatus as recited in claim 1, wherein said electrode zones define at least one capacitive sensor to detect the presence of either said substrate or a substrate support tray engagable by said blade.

4. The apparatus as recited in claim 3, wherein said capacitive sensor includes upper and lower electrodes formed respectively on said upper and lower ceramic layers of said blade, such that when said upper and lower ceramic layers of said blade are placed together, a small dielectric gap is formed between said electrodes.

5. The apparatus as recited in claim 1, wherein said upper and lower ceramic layers of said ceramic blade are sintered together.

6. The apparatus as recited in claim 1, wherein said lower ceramic layer of said ceramic blade has said port formed therethrough and said lower surface of said upper ceramic layer contains said at least one integral passageway formed therein such that, when said upper and lower ceramic layers of said ceramic blade are joined together, said port communicates with said passageway to permit a suction to be communicated via said passageway and port to said apertures beneath a substrate supported on said blade.

7. The apparatus as recited in claim 1, wherein said upper ceramic layer of said ceramic blade has said port formed therethrough and said lower surface of said upper ceramic layer contains said at least one integral passageway formed therein such that, when said upper and lower ceramic layers of said ceramic blade are joined together, said port communicates with said passageway to permit a suction to be communicated via said passageway and port to said apertures beneath a substrate supported on said blade.

8. The apparatus as recited in claim 1, wherein said lower ceramic layer of said ceramic blade has said port formed therethrough and said upper surface of said lower ceramic layer contains said at least one integral passageway formed therein such that, when said upper and lower ceramic layers of said ceramic blade are joined together, said port communicates with said passageway to permit a suction to be communicated via said passageway and port to said apertures beneath a substrate supported on said blade.

9. A composite ceramic blade for holding a substrate, wherein said blade can withstand substrates of varying temperature, comprising:

(a) an upper ceramic layer having an upper and a lower surface;

(b) a lower ceramic layer having an upper surface permanently attached to said lower surface of said upper ceramic layer;

(c) at least one integral passageway formed within said composite ceramic blade by forming a channel in one of said surfaces permanently attached to one another, such that the channel formed in said one surface cooperates with the surface attached thereto to form said integral passageway within said ceramic blade;

(d) at least one port defined in and extending through at least one of said layers and in communication with said at least one integral passageway for transmitting a vacuum to said integral passageway; and (e) one or more apertures in said upper ceramic layer adjacent to a leading edge of said blade and extending from said upper surface of said upper ceramic layer through said upper ceramic layer to said integral passageway, and spaced from said port, to thereby provide a vacuum at said one or more apertures, so as to render said blade capable of retaining a substrate placed over said one or more apertures.

* * * * *